United States Patent

[11] 3,545,606

[72] Inventors Benny Morris Bennett
6 Pennsylvania Ave., R.D. #1, Harrisburg, 17112;
Linn Stephen Lightner, 1 Boxwood Lane, Camp Hill, Pennsylvania 17011

[21] Appl. No. 736,191
[22] Filed June 11, 1968
Continuation-in-part of Ser. No. 692,344, Dec. 21, 1967, abandoned.
[45] Patented Dec. 8, 1970

[54] FLEXIBLE TAPE TERMINAL ASSEMBLY
7 Claims, 16 Drawing Figs.

[52] U.S. Cl. .......... 206/56; 29/203, 29/626; 206/65
[51] Int. Cl. .......... B65d 73/02
[50] Field of Search .......... 206/56(A), 56(A3), 65(F), 56(DF), 59(M); 29/630(D); 196/131; 339/221

[56] References Cited

UNITED STATES PATENTS

| | | | |
|---|---|---|---|
| 2,604,986 | 7/1952 | Berg | 206/65(F) |
| 3,027,004 | 3/1962 | Gluck | 206/65(F) |
| 3,069,751 | 12/1962 | Deakin | 206/65(F) |
| 3,182,276 | 5/1965 | Ruechlemann | 339/17(LC) |

*Primary Examiner*—Donald F. Norton
*Attorneys*—Curtis, Morris and Safford, Marshall M. Holcombe, William Hintze, William J. Keating, Frederick W. Raring, John R. Hopkins, Adrian J. La Rue and Jay L. Seitchik

ABSTRACT: Terminals for use in an insulating component carrying board are disclosed mounted in a general position of use on a flexible and resilient carrier tape with the ends thereof removably embedded therein and with the carrier tape having characteristics permitting reeling of the terminal-carrier assembly. Tools for precisely positioning the free ends of terminals as mounted on the carrier tape in alinement for insertion into holes in component boards are disclosed in several embodiments including one where the tool is removed axially after installation of the terminals and only after the carrier tape has been removed from the terminals. In a second embodiment the tool is hinged to be freed from the terminal-carrier assembly by an opening movement thereof. In a third embodiment the tool can be withdrawn in a transverse sense relative to terminals mounted in a component carrying board.

INVENTOR:
BENNY MORRIS BENNETT
LINN STEPHEN LIGHTNER
BY John R Hopkins

INVENTOR:

BENNY MORRIS BENNETT
LINN STEPHEN LIGHTNER

BY
John C. Hopkins

INVENTOR

BENNY MORRIS BENNETT
LINN STEPHEN LICHTNER

BY

John R Hopkins

FLEXIBLE TAPE TERMINAL ASSEMBLY

CROSS-REFERENCES TO RELATED APPLICATIONS

This application is a continuation-in-part of application Ser. No. 692,344 filed on Dec. 21, 1967, by Benny Morris Bennett et al., and now abandoned.

BACKGROUND OF THE INVENTION

A wide variety of electrical and/or electronic circuits are based upon a connection scheme featuring an insulating board carrying an array or matrix of terminals extending from one or both sides thereof. Such terminals may be in various configurations including post or pin portions utilized to interconnect components carried by modules or chips mounted on the board or plugged onto the terminals and to provide inputs to and outputs from circuits formed thereby. The terminals are in many instances tied together by electrical lead wires to form circuit connections. A constant effort toward miniaturization of electrical and electronic circuits has led to a terminal spacing which is frequently on the order of 0.100 of an inch, center-to-center, or less. The terminals employed are relatively small parts and the spacing requirement has caused a considerable installation and assembly problem. To solve the problem industry has turned to machines which install posts one at a time, automatically. In many instances, however, the setup time required for such machines cannot be warranted because the application involved is rather customized and only a limited number of circuits of any given pattern or configuration will be run at a given time. In many instances the package configuration of a circuit, even though requiring a relatively large number of terminals, does not lend itself to use with terminal inserting machines due to a lack of clearance around the area where the terminals must be inserted.

Another prior approach is disclosed in U.S. Pat. No. 3,182,276 to H. E. Ruehlemann where terminals are mounted in a hard thermoplastic material in an exact spacing for insertion into holes in a mounting board. Since the mounting strip must be sufficiently rigid to maintain the mounted contacts in exact alignment the approach requires a rather exact control of production tolerance and the product is available only in relatively short lengths or sticks.

SUMMARY OF THE INVENTION

The present invention is related to rapidly and accurately mounting terminals in insulating boards and, particularly to an assembly including a flexible strip carrying terminals generally on centers to be inserted in apertures in an insulating board and tooling for accomplishing a precise terminal placement and insertion in multiple.

It is an object of the present invention to provide a novel technique and structure for accurately, but quickly, mounting small parts in apertures in a support structure. It is a further object to provide a terminal-carrier assembly capable of being reeled for storage and ease of use which is of a configuration to facilitate mounting of arrays of terminals in apertures in a support structure without individually handling such terminals. It is yet a further object of the invention to provide tools for mounting tape-carried terminals in a rigid insulating support structure having arrays of small, precisely aligned apertures therein.

The present invention achieves the foregoing objects and overcomes the shortcomings of the prior art through an assembly of a flexible tape and terminals arrayed and carried thereon. One end of each terminal is embedded in the tape to hold the remainder of the terminal extending transversely to the tape. The tape is sufficiently flexible to facilitate reeling with the terminals carried thereon. The tape includes characteristics to hold the terminals in general alignment against accidental displacement but to permit removal from the terminals when desired. In accordance with a further aspect, the invention contemplates one tool embodiment comprised of a block of material having apertures therethrough precisely aligned with the apertures in a supporting board structure into which the terminals are to be inserted. The tool block includes at one end of each aperture a beveled surface which guides insertion of terminals in multiple as mounted on the carrier tape. In use, a series of terminals carried on a tape are inserted within the tool block with the block then being positioned against the surface of the support structure into which the terminals are to be fitted. The terminals are then pushed through the block and into the apertures of the support structure to be locked thereto by locking structure carried on the terminals or by soldering of the terminals into position. Thereafter, the carrier tape is peeled from the terminals and the tool block is then removed axially from the terminals.

Since the supply of terminals is from a reel, only as many terminals as needed for a given application need be used and there is no waste as with fixed length sticks of terminals as in the prior art. Also, since the terminals are only generally aligned on the tape, to be precisely aligned only when used in a tool, there is less problem in production and handling of the tape-terminal assembly, prior to use. Experience has shown that by providing exact alignment of the tape mounted terminals through a tool rather than using a rigid thermoplastic backing stamp, which must be melted prior to removal, terminals can be applied faster with an overall reduction in applied cost to the user.

In another embodiment the tool of the invention is comprised of a hinged structure adapted to be closed about a strip of terminals to precisely align the free end thereof for insertion into an array of apertures in a support structure. After the forward ends of the terminals have been inserted in apertures of a support structure and disposed inwardly into proper position, the tool is opened up and removed. After the terminals have been secured in the structure in a suitable manner the tape is then removed.

A further embodiment of a tool features a pair of sliding blocks which have transverse slots defining apertures spaced to receive a terminal-carrier assembly inserted axially to align the free ends of the terminals for insertion in a support block and to grip the terminal posts holding them in the aligned position during positioning of the tool into position on a support structure. The tool is freed from the terminals and removed transversely with the blocks thereof being displaced to align the slots therein and provide clearance. The tape can be removed either before or after tool removal.

DESCRIPTIONS OF PREFERRED EMBODIMENTS

Figure 1:
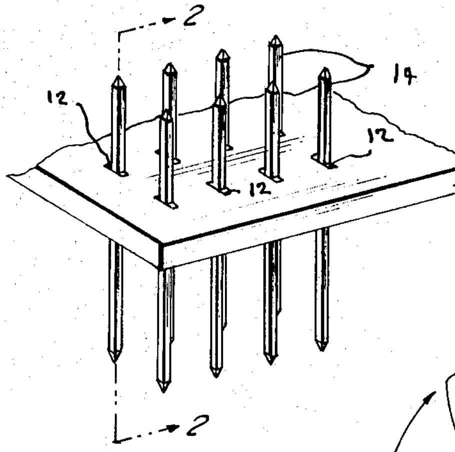
FIG. 1 is a perspective view, somewhat enlarged from actual size, of the corner of a board having an array of terminals affixed therein.

In FIG. 1 a terminal mounting structure in the form of an insulating board 10 is shown having a plurality of apertures 12 therein into which a plurality of terminal posts 14 are filled. The details of elements in FIG. 1 should be taken as illustrative for the general application of the invention means and methods and terminal members of other configurations mounted in mounting members of other configurations presenting an assembly problem are fully contemplated. The board 10 typically may be of a rigid thermosetting plastic material such as glass-loaded phenolic resin carrying on one or both surfaces thereof conductive paths in the form of copper sheet material bonded to the board surface and leading to and from components mounted elsewhere on the board. Alternatively, the board 10 may represent merely an interconnection matrix support for electrical leads to and from the various terminals being interconnected in a desired pattern from post to post by various techniques. Such techniques include soldering, Wire-Wrap, or TERMI-POINT: The Wire-Wrap technique being illustrated in U.S. Pat. No. 2,759,166 to Mallina granted Aug. 14, 1956; the TERMI-POINT technique being shown in U.S. Pat. No. 3,232,967 to Kreinberg et al. granted Feb. 1, 1966.

Figure 2:
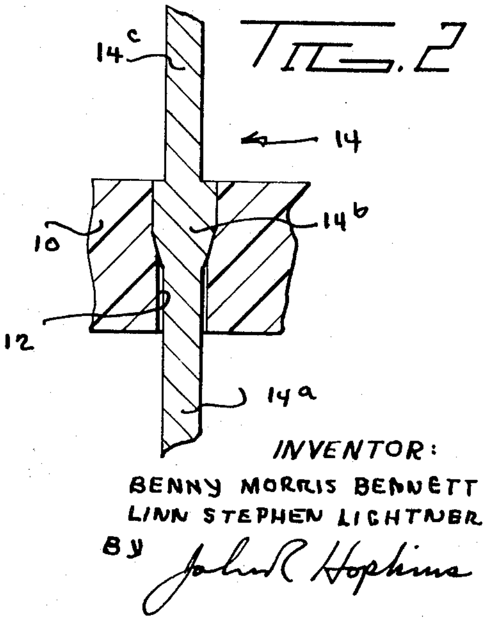
FIG. 2 is an enlarged sectional view taken along lines 2–2 of the structure shown in FIG. 1.
Figure 5:
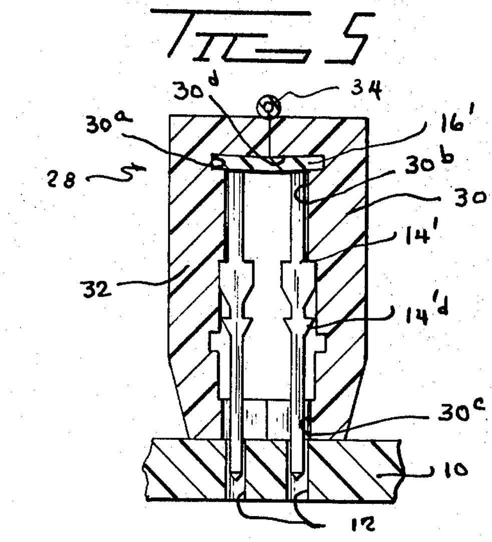
FIG. 5 is a cross-sectional view showing a terminal-carrier assembly positioned with the ends of the terminals inserted into a board in use with a tool of an alternative embodiment.
Figure 6:
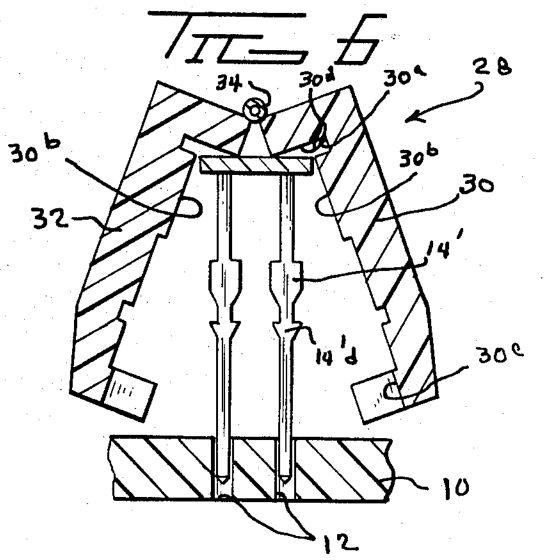
FIG. 6 is a view of the structure shown in FIG. 5 with the tool being removed from the terminal-carrier assembly.

Posts 14 are mounted in board 10 in a pattern facilitating the application of leads thereto by hand or machine through identification of coordinate position through a rather exact center-to-center placement of the posts on the board. The posts may have a configuration like that shown in FIG. 2 to be force fitted into the board and held within the aperture 12 thereof by a wedging and frictional loading of the board material surrounding the aperture 12. Alternatively, the posts may be rather loosely fitted within the apertures 12 of the board to be fixed therein by soldering of the posts to circuit paths disposed on the board surface. As a further alternative, posts may include barbs or the like made to bite into the board material or else they may have deformable ears bent over to lock the post into the board. In the illustrative embodiment shown in the present application the post 14 includes a lower portion 14*a* which has a square cross-sectional configuration; a center mounting portion 14*b* dimensioned to wedge-fit within the aperture 12; and an upper post portion of square cross-sectional configuration shown as 14*c*. In a typical application the lower post portions 14*a* may be interconnected in various patterns by any suitable means such as by Wire-Wrap or TERMI-POINT techniques with the upper portions 14*c* being connected to component carrying modules on a card or the like having contact springs spaced and dimensioned to fit thereon. Alternatively, the post portions 14*a* and 14*c* may be interconnected in suitable patterns and by input and output leads joining circuit components located elsewhere. In many applications the board 10 will be large enough to accommodate several hundred or several thousand posts extending in rows and columns and across the entire surface thereof. In other applications a board 10 may contain electrical or electronic components interconnected to form a functioning circuit with groups of posts disposed around the edge of the board or in different locations on the board in appropriate locations to facilitate interconnection. In this latter application the groups may contain ten, twenty or perhaps sixty posts in any one location.

In both of the foregoing applications it is a usual practice to form the board with apertures therein into which posts may be placed. The apertures may be formed by being molded into the board or by being drilled therein, or, if the board is relatively thin, by being punched therein. In a typical application the center-to-center spacing between posts may be on the order of 0.150 of an inch down to 0.025 of an inch; 0.100 of an inch being a typical center-to-center spacing. A typical terminal post like that shown in the accompanying drawings might have typical dimensions of approximately 1 inch in length with the upper and lower portions being on the order of 0.025 of an inch square. Rectangular posts on the order of 0.022 by 0.036 of an inch are also used. As can be appreciated, posts of this size are difficult to handle physically. This difficulty is made even greater when numerous posts must be inserted into apertures of approximately the same dimension located in a precise pattern in a board. The problem with handling posts and inserting them in board apertures is made more difficult as the posts become smaller in size and the advantage of the present invention becomes more important as the elements involved become smaller in size.

Figure 3:
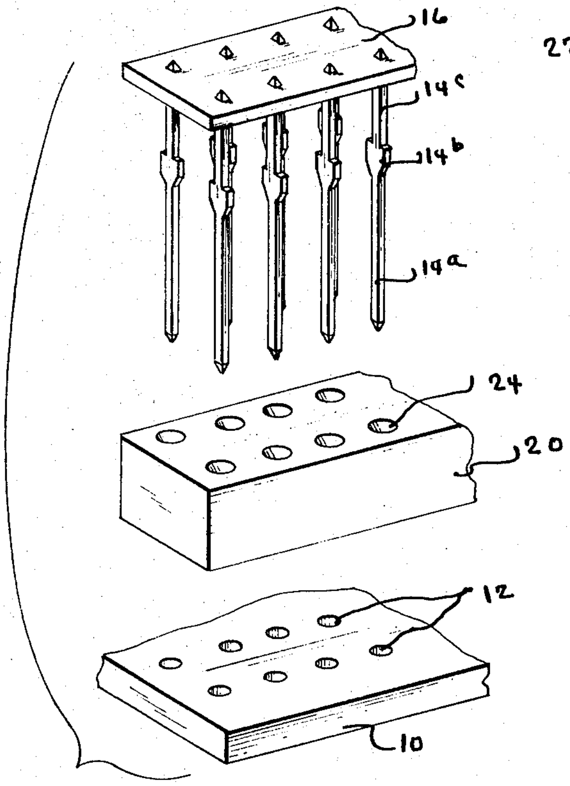
FIG. 3 is a perspective view showing the board of FIG. 1 prior to mounting terminals therein and further showing a terminal carrier assembly relative to one tool embodiment for aligning and mounting the terminals in the board.
Figure 15:
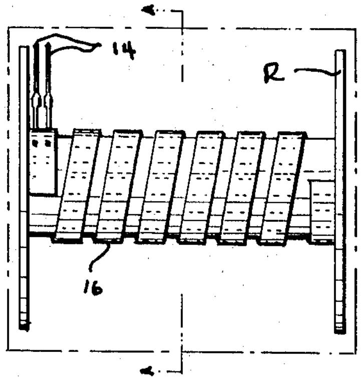
FIGS. 15 and 16 are plan and side views of a reeled terminal-carrier assembly, respectively.
Figure 16:
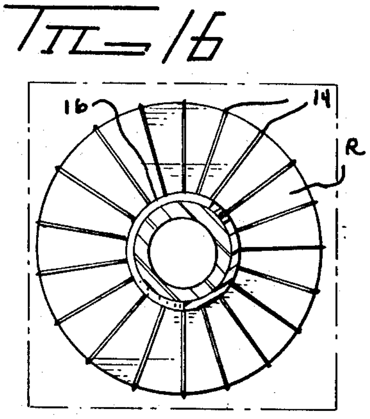

In accordance with the invention in one aspect thereof, terminal posts like 14 are mounted on a carrier tape 16 as shown in FIG. 3 and in FIGS. 15 and 16. The ends of the post portions 14*c* are forced into the material of the tape in an approximate position relative to the spacing of apertures in a board in which the posts are to be mounted. Piercing of the tape without fracture can be achieved with properly resilient material and pointing of the posts. The posts are held in the tape solely by the engagement of the material of the tape with one end thereof. In accordance with the invention, the tape is of a flexible material permitting the terminal-carrier to be reeled for storage and ease of use. FIG. 15 shows a continuous tape 16 carrying a double row of posts thereon spirally reeled on a reel R. While a double row of posts is shown mounted on tape 16, single rows of posts or rows of three or six or more posts on a tape are contemplated. The tape 16 must be sufficiently resilient to receive the posts forced therein without cracking so as to retain the post from accidental displacement. In an actual embodiment of the invention a polyethylene tape approximately 0.065 of an inch in thickness and 0.300 of an inch in width worked quite satisfactorily to accommodate a double row of terminal posts like the posts 14. The same tape, approximately 0.150 of an inch wide, worked satisfactorily for a single row of posts. A polyethylene tape of the foregoing dimensions carrying a double row of posts having a 0.025 of an inch square end, pointed in the manner indicated in FIG. 1 and mounted on 0.100 of an inch centers is capable of being reeled about a reel cylinder of a diameter of approximately 18 inches, providing a storage capacity of 10,000 posts for a reel approximately 6 inches long.

In accordance with a further aspect of the invention a number of tools facilitating use of the terminal-carrier assembly are contemplated.

Figure 4:
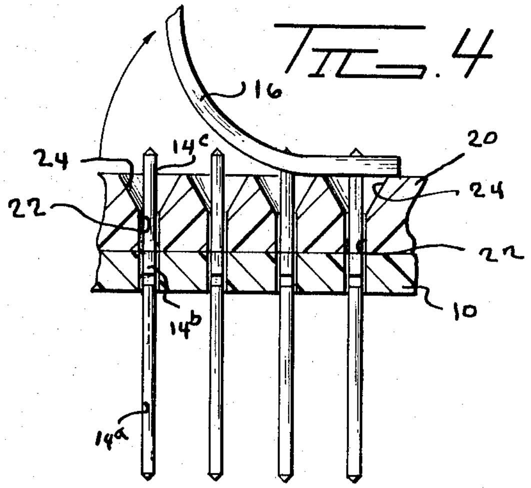
FIG. 4 is a sectional view showing th in greater detail the use of the tool of FIG. 3 and showing the removal of the carrier tape from the terminals affixed in the board.

In FIG. 3 one version of the tool of the invention is shown to include a block 20 which may be of a plastic material such as nylon or a harder material such as phenolic resin. The block 20 includes a series of apertures 22 arranged in the pattern matching a pattern of apertures 12 in a board 10. As indicated in FIG. 4 the apertures 22 open outwardly in a beveled configuration shown as 24 leading to the top surface of the block 20. The portions 24 serve to guide the ends of posts into the apertures 22. In accordance with the invention a strip of tape of a given length such as perhaps the length shown in FIG. 3 carrying eight posts in two rows of four is first severed from a supply as from the reel shown in FIG. 15. The strip is then positioned as generally shown in FIG. 3 with the free ends of the posts generally aligned with the apertures 24 of the block. The assembly is then displaced relative to the block 20 so that the free ends of the posts 14 enter into the portions 24 of the block and down into the block apertures 22. With the block and the terminal-carrier assembly held together the block is then positioned down over the board 10 until the apertures 22 are aligned with the apertures 12 in the board. The assembly is then disposed downwardly with the posts 14 entering into the apertures of the board and being axially displaced downwardly until the posts wedge into the apertures of the board and become fixed therein.

In the event that the posts employed relative to the board apertures are not of the wedging type, the block 20 and the terminal-carrier assembly may be left on the board until the posts have been soldered into position, deformed or otherwise locked into place on the board. In any event, after the posts have been locked to the board, the tape 16 is removed from the ends of the posts in the manner indicated in FIG. 4 and then block 20 is removed. With the flexible tape of the invention peeling of the tape off the ends of the terminal posts may be accomplished without heating, melting or fracturing the material of the tape. The tool formed by block 20 greatly facilitates removal of the tape without running the risk of bending, deforming or loosening posts mounted within board 10. For this reason the embodiment of the invention represented by block 20 may be preferred in uses of particularly small or relatively delicate terminals. Using the terminal-carrier assembly and block 20, terminal posts can be positioned and affixed within a board in a fraction of the time it takes to insert posts by hand. This operation can be accomplished with boards of configurations which cannot be served by some automatic staking machine, requiring clearance for addressing the board. As disclosed, the invention embodied in FIGS. 3 and 4 presents a method and apparatus which is inexpensive and which affords a rapid and reliable insertion of relatively small elements into precise positions defined by apertures in terminal mounting boards.

Figures 7, 8, 9:
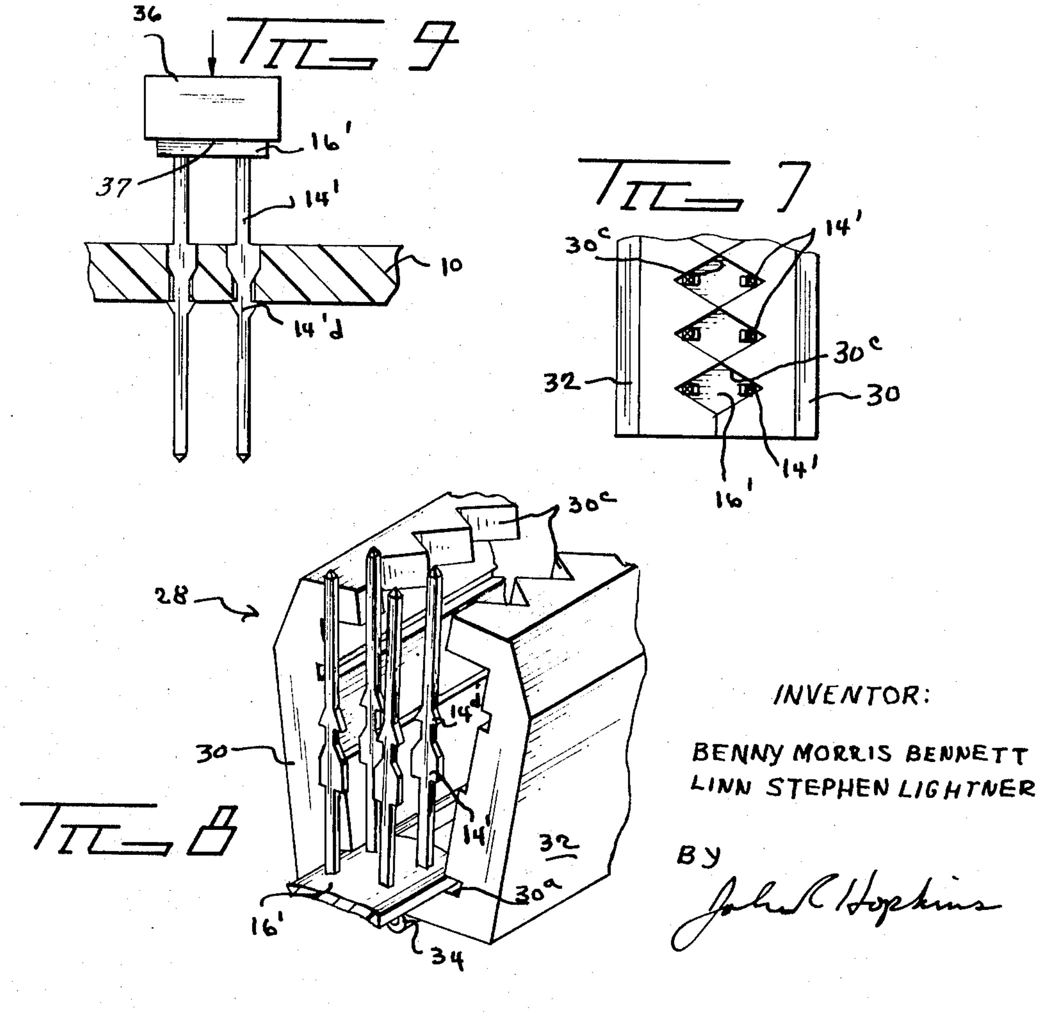
FIG. 7 is a bottom view of the structure of FIG. 5 showing the configuration of slots in the tool embodiment of FIG. 5 in engagement with the free ends of terminals to align such for insertion in a printed-circuit board.
FIG. 8 is a perspective view showing the tool structure of FIG. 5 from the bottom being applied to a terminal-carrier assembly.
FIG. 9 is a cross-sectional view of a board depicting the final placement of a terminal-carrier assembly therein.

Turning now to an alternative embodiment of the invention reference is made to FIGS. 5—8 showing a terminal board like that previously described referenced by numeral 10, including two rows of apertures 12 into which terminal posts 14′ are to be fitted. The terminal posts 14′ include barbs **14′*d* in addition to the features of the posts previously described. The barbs 14′*d* serve to lock the terminal posts into the board by an engagement with the rear surface thereof after being forced through apertures 12 in the board. In accordance with the invention concept a tool 28 as illustrated in FIGS. 7 and 8 is comprised of channeled halves 30 and 32 hinged together as at 34. The halves can be opened to receive a portion of a terminal-carrier assembly and closed together to hold the assembly to accurately position the free ends of the posts 14′. Each half of tool 28 includes at the top, as shown with respect to half 30, a recess 30*a* adapted to accommodate the edge of the tape 16′. Extending from recess 30*a* is an inside surface shown as 30*b* which terminates at the bottom of the tool element in a V-shaped vertical recess shown as 30*c*. In a preferred embodiment each of the recesses 30*a* has an upper surface sloped slightly inwardly in the manner shown by the numeral 30*d*. When the two halves of the tool are closed together in the manner shown in FIG. 5 the center of tape 16′ is deformed downwardly which tends to displace the free ends of the post outwardly. This serves to bias the free ends of the posts against the V-shaped surfaces of the recesses defined by teeth at 30*c* in the manner shown in FIG. 7. The free ends of the posts which are to be eventually placed in apertures in a board 10 are thus precisely aligned in the tool 28. With the tool closed in the manner indicated in FIG. 7 the assembly of strip terminals carried in the closed tool may then be positioned over a board 10 with the ends of the posts protruding from the tool to be inserted within apertures 12. As soon as the ends of the posts have been inserted in the board apertures, the two halves of tool 28 may then be opened in a manner shown in FIG. 6 and removed from the terminal-carrier assembly. Thereafter, the posts may then be driven in to lock into the board 10 in the manner shown in FIG. 9 by pressure applied to the tops of the posts by a tool element like 36 which may be simply a piece of bar steel or the like having a lower surface 37 which is roughened to keep the tool element 36 from sliding relative to the plastic of the strip or the terminals. Once the posts are locked into the board tape 16′ may be peeled off the posts in the manner heretofore detailed in FIG. 4. In accordance with the invention the halves of tool 28 may be formed by a plastic extrusion with the V-shaped teeth 30*c* being machined therein or they may be molded in the configuration shown, if desired, out of some suitable plastic, either thermoplastic or thermosetting plastic. Alternatively, and in an actual embodiment, the tool halves may be formed of metal such as an aluminum extrusion machined to define the teeth surfaces depicted by 30*c*. The tool of FIGS. 5—9 may be used without severing the tape 16′** and any length of terminal-carrier can be accommodated by working the tool along a board.

Figures 10, 11, 12, 13, 14:
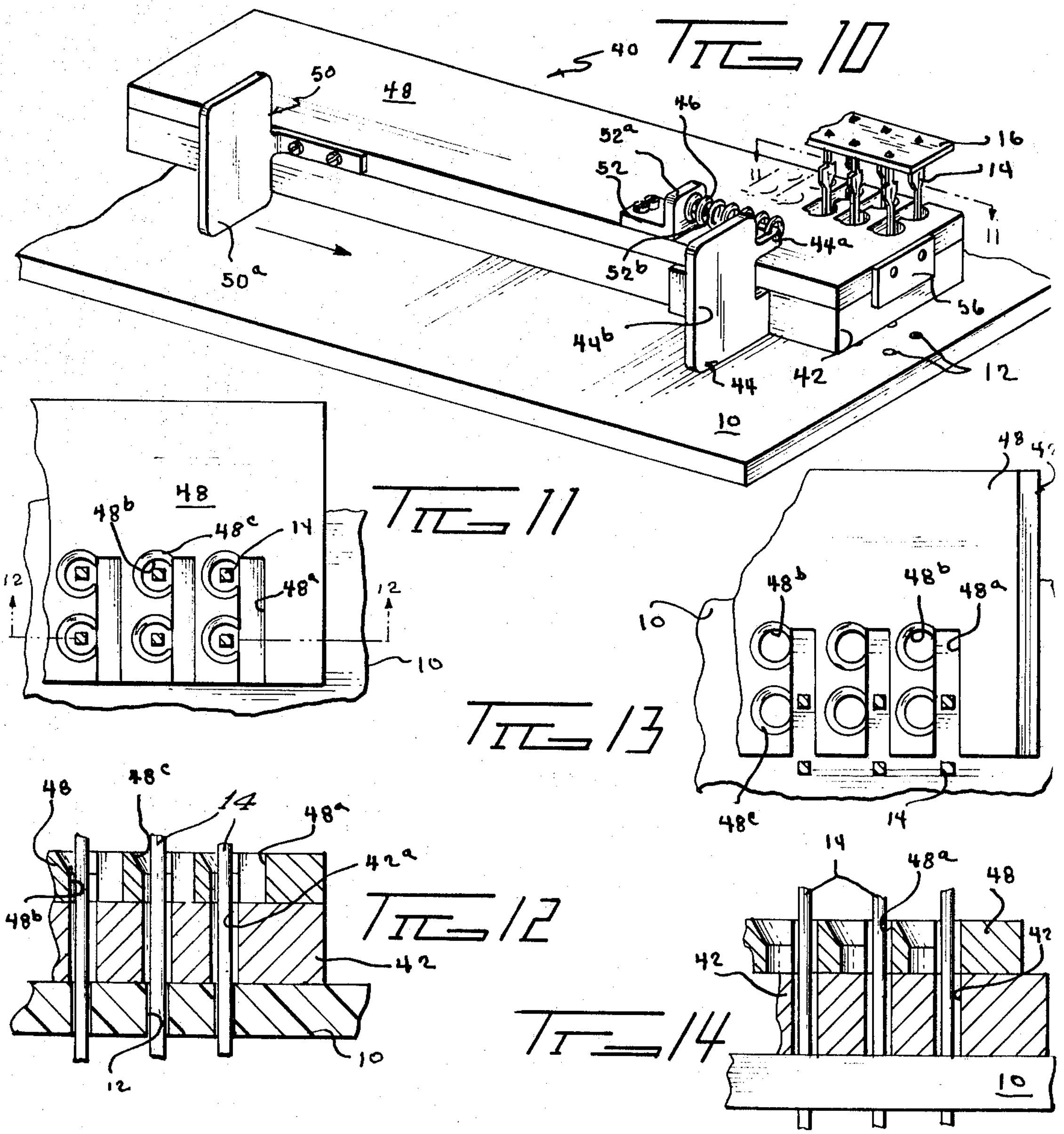
FIG. 10 is a perspective view of a terminal-carrier assembly as mounted in a tool in accordance with still a further embodiment of the invention.
FIG. 11 is a view through lines 11–11 of FIG. 10 showing the right end portion of the tool in a closed position.
FIG. 12 is a side view in section taken along lines 12–12 of FIG. 11.
FIG. 13 is a view from the top of the tool of FIG. 10 showing the tool in an opened position.
FIG. 14 is a side view in section of the tool as depicted in FIG. 13.

Turning now to a further alternative tool embodiment, FIG. 10 shows a board 10 having rows of apertures 12 therein into which terminal posts are to be fitted. A terminal-carrier assembly including a tape 16 carrying posts 14 is shown positioned in a tool 40 above the rows of apertures 12. The tool 40 is comprised of a lower block 42 having a plurality of transverse slots **42*a* as shown in FIGS. 11—14 extending partway across the block. The slots 42*a* are sufficiently wide to accommodate a range of post sizes and configurations including rectangular posts often employed in lieu of the square post as actually depicted in FIGS. 10—14. The slots 42*a* are on centers approximating the center-to-center spacing of the apertures in a board of use. As shown in FIG. 10, attached to the right end of block 42 is a member 44 which may be formed of sheet metal or the like to include a projecting portion 44*a* carrying a compression spring 46. A surface 44*b* is positioned to accommodate a use of the tool in the hand of an operator, the thumb or finger of the operator engaging the surface 44*b* when the tool is to be removed from a terminal-carrier assembly. The tool 40 further includes an upper block 48 which has along one edge thereof a series of transverse slots 48*a* which lead to recesses 48*b* positioned on centers corresponding to the centers of apertures 12 and of the posts 14 of a terminal-carrier assembly. The apertures 48*b* are beveled or tapered in the upper portion thereof as at 48*c* to guide the free ends of posts into the block apertures. Attached to the upper block 48 to the left as shown in FIG. 10 is a member 50 including a portion 50*a* positioned to accommodate hand use. Attached to the top surface of the block 48 is a member 52 having an upstanding portion 52*a* and a projecting portion 52*b* which carries and centers spring 46 on the member 52. The spring 46 tends to displace block 48 to the left relative to block 42. Means such as a plate 56 limits leftward movement of block 48. With the block 48 in the position shown in FIG. 10 and also in FIGS. 11 and 12, posts 14 as carried on a tape 16 are inserted downwardly to be held within the apertures 42*a* and 48*b*. The tool 40 is then positioned on the board surface with the posts held aligned relative to the apertures 12 in the board. The posts are then pushed down with the free ends thereof entering the apertures. Movement of 44 relative to 50 causes relative movement of the blocks 42 and 48 to the position shown in FIGS. 13 and 14 permitting the tool to be removed from the terminal-carrier assembly, leaving the posts positioned in the apertures 12 of the board 10. FIGS. 13 and 14, indicate how the slots of the blocks 42 and 48** are aligned to permit a side removal of the tool.

In the foregoing description the invention has been disclosed in a number of embodiments as to article, method and apparatus. It is to be understood that the various embodiments all are considered to provide an advantage in mounting terminals and the like in apertured board members, with any preference for one embodiment over the other depending upon the particular application involved. Such factors as the number of terminals involved, the particular pattern of terminals to be installed, the number of boards involved in a given tooling setup, the size of terminals for a given application, and access to the site of terminal placement relative to surrounding components of structure, may be determinative.

We claim:

1. As an article of manufacture, an assembly including a thin tape of flexible and resilient material and an array of terminal members each including a first end portion dimensioned to be inserted within the aperture of a board member and a second end portion dimensioned to be forced into the said tape piercing the material thereof causing said terminal members to be held in said tape, the said array of terminal members being carried by said tape, with the second end portions embedded in the material of said tape in positions substantially similar to positions of apertures in a board member into which the first end portions of said terminal members are to be inserted, the said tape further having material characteristics and a configuration relative to the spacing between terminal members to permit said assembly to be reeled.

2. As an article of manufacture, an assembly including a reel having a thin tape of flexible and resilient material helically disposed thereon, a plurality of terminals each including a first end portion dimensioned to be inserted within an aperture in a board member and a second end portion forced into said tape, the said terminal second end portions being positioned on said tape in a pattern substantially similar to the pattern of apertures in a board member into which said terminals are to be inserted with the said first end portions extending radially outward of said tape as reeled.

3. As an article of manufacture, an assembly including a thin tape of flexible and resilient material and an array of terminal members each including a first end portion dimensioned to be inserted within the aperture of a board member and a second end portion dimensioned to be forced into the said tape piercing the material thereof causing said terminal members to be held in said tape, the said array of terminal members being carried by said tape, with the second end portions embedded in the material of said tape in positions substantially similar to positions of apertures in a board member into which the first end portions of said terminal members are to be inserted, a said second end portions being pointed to facilitate penetration of said tape without fracture, the said tape further having material characteristics and a configuration relative to the spacing between terminal members to permit said assembly to be reeled.

4. As an article of manufacture, an assembly including a thin tape of flexible and resilient material and an array of terminal members each including a first end portion dimensioned to be inserted within the aperture of a board member and a second end portion dimensioned to be forced into the said tape piercing the material thereof causing said terminal members to be held in said tape, the said array of terminal members being carried by said tape, with the second end portions embedded in the material of said tape in positions substantially similar to positions of apertures in a board member into which the first end portions of said terminal members are to be inserted, the said tape further having material characteristics and a configuration relative to the spacing between terminal members to permit said assembly to be reeled, the said terminal members being post members of a length dimension many times greater than any given width dimension as viewed at a typical cross section of a post member.

5. As an article of manufacture, an assembly including a reel having a thin tape of flexible and resilient material helically disposed thereon, a plurality of terminals each including a first end portion dimensioned to be inserted within an aperture in a board member and a second end portion forced into said tape, the said terminal second end portions being positioned on said tape in a pattern substantially similar to the pattern of apertures in a board member into which said terminals are to be inserted with the said first end portions extending radially outward of said tape as reeled, said second end portions of said terminals being pointed to facilitate penetration of said tape without fracture.

6. As an article of manufacture, an assembly including a reel having a thin tape of flexible and resilient material helically disposed thereon, a plurality of terminals each including a first end portion dimensioned to be inserted within an aperture in a board member and a second end portion forced into said tape, the said terminal second end portions being positioned on said tape in a pattern substantially similar to the pattern of apertures in a board member into which said terminals are to be inserted with the said first end portions extending radially outward of said tape as reeled, the said terminals being post members of a length dimension many times greater than any given width dimension as viewed at a typical cross section of a member.

7. As an article of manufacture, an assembly including a thin tape of flexible and resilient material and an array of terminal members each including a a first end portion dimensioned to be inserted within the aperture of a board member and a second end portion dimensioned to be mechanically forced into the said tape piercing and penetrating the material thereof without fracture of the tape causing said terminal members to be held in said tape solely by the engagement of the material of the tape with said second end portions, the said array of terminal members being carried by said tape, with the second end portions embedded in the material of said tape in positions substantially similar to positions of apertures in a board member into which the first end portions of said terminal members are to be inserted, the said tape further having material characteristics and a configuration relative to the spacing between terminal members to permit said assembly to be reeled.

PO-1050
(5/69)

UNITED STATES PATENT OFFICE
CERTIFICATE OF CORRECTION

Patent No. 3,545,606 Dated December 8, 1970

Inventor(s) BENNY MORRIS BENNETT, LINN STEPHEN LIGHTNER

It is certified that error appears in the above-identified patent and that said Letters Patent are hereby corrected as shown below:

United States Patent is assigned to AMP Incorporated, Harrisburg, Pennsylvania, 17105

Signed and Sealed this

*sixteenth* Day of *March 1976*

[SEAL]

*Attest:*

RUTH C. MASON
*Attesting Officer*

C. MARSHALL DANN
*Commissioner of Patents and Trademarks*